(12) United States Patent
Lin et al.

(10) Patent No.: US 10,236,395 B2
(45) Date of Patent: Mar. 19, 2019

(54) ANTIREFLECTION SUBSTRATE STRUCTURE AND MANUFACTURING METHOD THEREOF

(71) Applicants: Tatung Company, Taipei (TW); TATUNG UNIVERSITY, Taipei (TW)

(72) Inventors: Chiung-Wei Lin, Taipei (TW); Jheng-Jie Ruan, Taipei (TW); Yi-Liang Chen, Taipei (TW); Hsien-Chieh Lin, Taipei (TW)

(73) Assignees: Tatung Company, Taipei (TW); TATUNG UNIVERSITY, Taipei (TW)

( * ) Notice: Subject to any disclaimer, the term of this patent is extended or adjusted under 35 U.S.C. 154(b) by 0 days.

(21) Appl. No.: 14/949,897

(22) Filed: Nov. 24, 2015

(65) Prior Publication Data

US 2016/0079449 A1 Mar. 17, 2016

Related U.S. Application Data

(62) Division of application No. 13/761,158, filed on Feb. 7, 2013, now Pat. No. 9,224,893.

(30) Foreign Application Priority Data

Dec. 6, 2012 (TW) .............................. 101145833 A

(51) Int. Cl.
*H01L 31/0216* (2014.01)
*H01L 31/0236* (2006.01)

(52) U.S. Cl.
CPC .... *H01L 31/02168* (2013.01); *H01L 31/0216* (2013.01); *H01L 31/0236* (2013.01); *Y02E 10/50* (2013.01)

(58) Field of Classification Search
CPC ..... H01L 31/02; H01L 31/18; H01L 31/0236; H01L 31/02168; H01L 31/022425;
(Continued)

(56) References Cited

U.S. PATENT DOCUMENTS

2004/0198850 A1* 10/2004 Connor ................. B29C 67/202
521/50
2006/0278287 A1* 12/2006 Fielden ................ B01J 19/0093
137/806

(Continued)

FOREIGN PATENT DOCUMENTS

| JP | 2009-128538 | * | 6/2009 | ............... G02B 1/11 |
| JP | 2009128538 | * | 6/2009 | |
| JP | 2009128538 A | * | 6/2009 | |

*Primary Examiner* — Jose R Diaz
(74) *Attorney, Agent, or Firm* — JCIPRNET

(57) ABSTRACT

A manufacturing method of antireflection substrate structure includes: providing a silicon wafer having a first rough surface; forming an antireflection optical film on the silicon wafer, wherein the antireflection optical film conformally overlays the first rough surface; performing a surface treatment on the antireflection optical film so that the antireflection optical film has a hydrophilic surface, and the hydrophilic surface is relatively far away from the silicon wafer; dropping a colloidal solution on the hydrophilic surface of the antireflection optical film, wherein the colloidal solution includes a solution and multiple nano-balls and the nano-balls are adhered onto the hydrophilic surface; and performing an etching process on the hydrophilic surface of the antireflection optical film by taking the nano-balls as an etching mask so as to form a second rough surface, wherein the roughness of the second rough surface is different from the roughness of the first rough surface.

5 Claims, 4 Drawing Sheets

(58) Field of Classification Search
CPC ............. H01L 31/0216; H01L 31/0218; B29C 67/202; B82Y 30/00; G02B 1/11; G02B 1/111–1/116; B01J 19/0093
USPC .............. 257/437; 438/72, 71; 351/159, 256
See application file for complete search history.

(56) References Cited

U.S. PATENT DOCUMENTS

| | | | | |
|---|---|---|---|---|
| 2007/0059942 A1* | 3/2007 | Hu | .................... | C23C 16/45523 438/763 |
| 2013/0142994 A1* | 6/2013 | Wang | ...................... | C03C 15/00 428/141 |
| 2013/0298977 A1* | 11/2013 | Chen | ...................... | B82Y 30/00 136/255 |
| 2014/0038339 A1* | 2/2014 | Yang | ................. | H01L 31/02242 438/71 |

* cited by examiner

ANTIREFLECTION SUBSTRATE STRUCTURE AND MANUFACTURING METHOD THEREOF

CROSS-REFERENCE TO RELATED APPLICATION

This application is a divisional application of and claims the priority benefit of U.S. application Ser. No. 13/761,158, filed on Feb. 7, 2013, now allowed, which claims the priority benefit of Taiwan application serial no. 101145833, filed on Dec. 6, 2012. The entirety of each of the above-mentioned patent applications is hereby incorporated by reference herein and made a part of this specification.

BACKGROUND

Field of the Disclosure

The disclosure generally relates to a substrate structure and a manufacturing method thereof, and more particularly, to an antireflection substrate structure and a manufacturing method thereof.

Description of Related Art

Generally, a silicon wafer itself has a different directivity due to the crystallization of different ways. A silicon wafer with a single direction can form a regular-changed pyramid structure on the surface of the silicon wafer by an etching process, wherein localized etching produces difference. However, in terms of the formed regular-changed pyramid structure, the incident light reflectance of the pyramid structure is still high, which is mainly because of the smooth surface and the regular angle variation of the pyramid structure, so that the reflectance of the broadband spectral light can not be effectively reduced.

In order to solve the above-mentioned problem, in the prior art, an antireflection optical film is re-deposited on a silicon wafer, that is, the antireflection optical film is conformally disposed on the pyramid structure on the surface of the silicon wafer. As a result, when a local destructive interference occurs with the incident light and the antireflection optical film interface, the antireflection optical film with a fixed film thickness is affected by the light with specific wavelengths only, while the incident light reflectance for the light with other wavelengths still remains high.

SUMMARY OF THE DISCLOSURE

Accordingly, the disclosure is directed to an antireflection substrate structure, which can reduce the incident light reflectance of different wavelength.

The disclosure is also directed to a manufacturing method of antireflection substrate structure for manufacturing the above-mentioned antireflection substrate structure.

The disclosure provides a manufacturing method of antireflection substrate structure, which includes: providing a silicon wafer having a first rough surface; forming an antireflection optical film on the silicon wafer, in which the antireflection optical film conformally overlays the first rough surface; performing a surface treatment on the antireflection optical film so that the antireflection optical film has a hydrophilic surface, in which the hydrophilic surface is relatively far away from the silicon wafer; dropping a colloidal solution on the hydrophilic surface of the antireflection optical film, in which the colloidal solution includes a solution and a plurality of nano-balls and the nano-balls are adhered onto the hydrophilic surface; and performing an etching process on the hydrophilic surface of the antireflection optical film by taking the nano-balls as an etching mask so as to form a second rough surface, in which the roughness of the second rough surface is different from the roughness of the first rough surface.

In an embodiment of the disclosure, the step of providing the silicon wafer includes: providing a monocrystalline-silicon silicon wafer substrate; and performing an etching process on a surface of the monocrystalline-silicon silicon wafer substrate to form the silicon wafer with the first rough surface.

In an embodiment of the disclosure, the silicon wafer is a polysilicon silicon wafer.

In an embodiment of the disclosure, the method of forming the antireflection optical film includes plasma enhanced chemical vapor deposition method, physical vapor deposition method or physical sputtering method.

In an embodiment of the disclosure, the material of the antireflection optical film includes silicon nitride, aluminium oxide, zinc sulphide, magnesium fluoride or titanium dioxide.

In an embodiment of the disclosure, the surface treatment includes using an oxygen plasma to perform the surface treatment.

In an embodiment of the disclosure, the oxygen flow rate of the oxygen plasma is between 1 sccm to 100 sccm, the processing time is between 20-2000 seconds, while the energy is between 20 mW/cm$^2$ and 500 mW/cm$^2$.

In an embodiment of the disclosure, the solution includes methanol and water.

In an embodiment of the disclosure, the material of each of the nano-balls includes polystyrene.

In an embodiment of the disclosure, the particle diameter of each the nano-ball is between 100 nm and 1000 nm.

In an embodiment of the disclosure, the etching process is a reactive ion etching process.

In an embodiment of the disclosure, the thickness of the antireflection optical film is between 100 nm and 1000 nm.

In an embodiment of the disclosure, the roughness of the first rough surface is between 100 nm and 10000 nm.

In an embodiment of the disclosure, the roughness of the second rough surface is between 10 nm and 100 nm.

The disclosure also provides an antireflection substrate structure, which includes a silicon wafer and an antireflection optical film, in which the silicon wafer has a first rough surface and the antireflection optical film is disposed on the silicon wafer and overlays the first rough surface. The antireflection optical film has a second rough surface and the roughness of the second rough surface is different from the roughness of the first rough surface, and the second rough surface has hydrophilicity.

In an embodiment of the disclosure, the silicon wafer includes a polysilicon silicon wafer or an etched monocrystalline-silicon silicon wafer.

In an embodiment of the disclosure, the material of the antireflection optical film includes silicon nitride, aluminium oxide, zinc sulphide, magnesium fluoride or titanium dioxide.

In an embodiment of the disclosure, the roughness of the first rough surface is between 100 nm and 10000 nm.

In an embodiment of the disclosure, the roughness of the second rough surface is between 10 nm and 100 nm.

Based on the description above, since the disclosure uses the nano-balls as an etching mask to perform an etching process on the antireflection optical film with an even film thickness to form the antireflection optical film having the second rough surface, so that when incident light with different wavelength irradiates the antireflection optical film, the second rough surface of the antireflection optical film and the incident light produce a destructive interference, not limited to the incident light with specific wavelength to produce the destructive interference only. Therefore, the antireflection substrate structure of the disclosure has a better antireflective capacity and can be applied to a broader application range.

Several exemplary embodiments accompanied with figures are described in detail below to further describe the invention in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the invention.

DESCRIPTION OF THE EMBODIMENTS

Figure 1A:
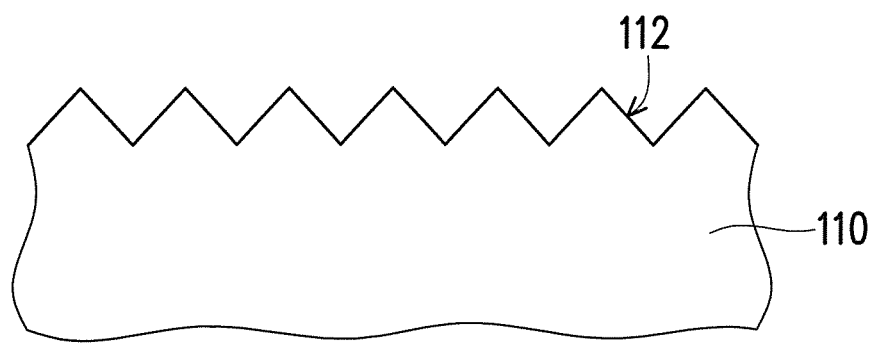
FIGS. 1A-1E are cross-sectional diagrams showing a manufacturing method of antireflection substrate structure according to an embodiment of the disclosure.

FIGS. 1A-1E are cross-sectional diagrams showing a manufacturing method of antireflection substrate structure according to an embodiment of the disclosure. Referring to FIG. 1A, the manufacturing method of antireflection substrate structure, according to the embodiment, includes following steps. First, a silicon wafer 110 is provided, in which the silicon wafer 110 has a first rough surface 112. In the embodiment, the silicon wafer 110 can be, for example, a polysilicon silicon wafer, or, as shown by FIGS. 2A-2B, a silicon wafer 110 with the first rough surface 112 formed by performing an etching process on a surface 112a of a monocrystalline-silicon silicon wafer substrate 110a, which the disclosure is not limited to. The roughness of the first rough surface 112 herein is between 100 nm and 10000 nm and the profile of the first rough surface 112 is, for example, a regular and continuous pyramid structure.

Figure 1B:
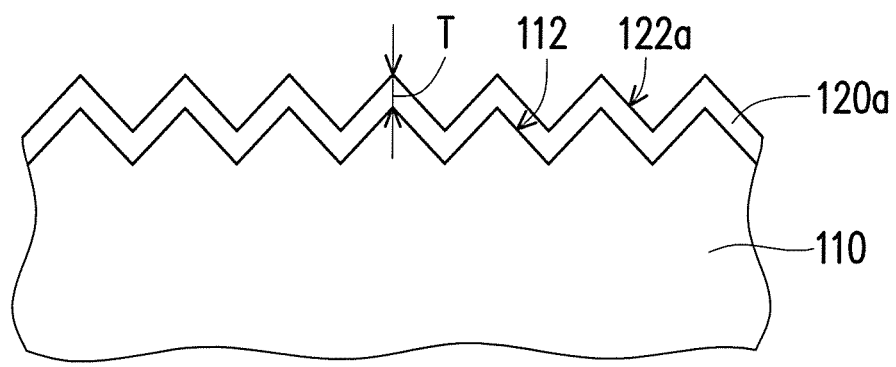
Figure 2A:
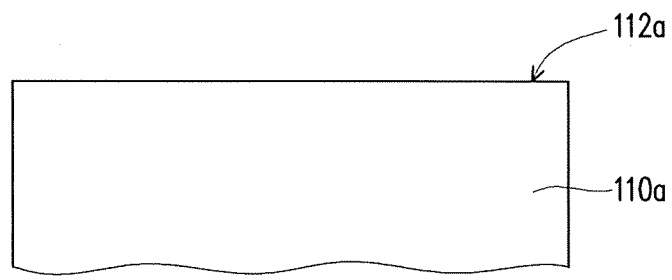
FIGS. 2A-2B are cross-sectional diagrams showing a manufacturing method of silicon wafer of FIG. 1A according to an embodiment of the disclosure.
Figure 2B:
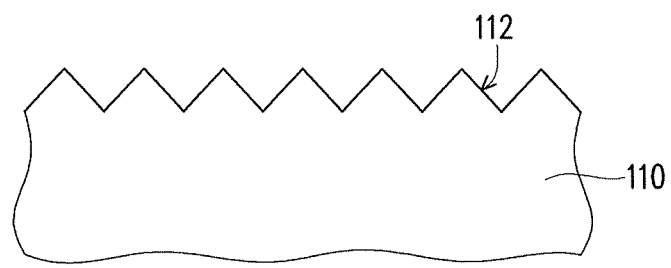

Next, referring to FIG. 1B, an antireflection optical film 120a is formed on the silicon wafer 110, in which the antireflection optical film 120a conformally overlays the first rough surface 112 of the silicon wafer 110. At the time, the antireflection optical film 120a has an even thickness to be disposed on the silicon wafer 110, in which the thickness T of the antireflection optical film 120a is between 100 nm and 1000 nm, the method of forming the antireflection optical film 120a is, for example, plasma enhanced chemical vapor deposition method, physical vapor deposition method or physical sputtering method, and the material of the antireflection optical film 120a is, for example, silicon nitride, aluminium oxide, zinc sulphide, magnesium fluoride or titanium dioxide.

After that, referring to FIG. 1B again, a surface treatment is performed on the antireflection optical film 120a so that the antireflection optical film 120a has a hydrophilic surface 122a, in which the hydrophilic surface 122a is relatively far away from the silicon wafer 110. The surface treatment herein is performed by using an oxygen plasma, in which the oxygen flow rate of oxygen plasma is between 1 sccm to 100 sccm, the processing time is between 20-2000 seconds, while the energy is between 20 mW/cm$^2$ and 500 mW/cm$^2$.

Figure 1C:
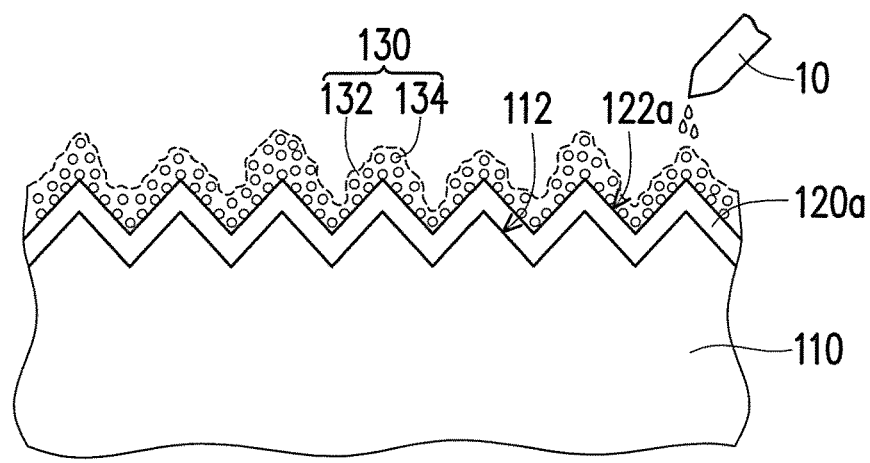

Then, referring to FIG. 1C, a dropper 10 is used to drop a colloidal solution 130 onto the hydrophilic surface 122a of the antireflection optical film 120a, in which the colloidal solution 130 includes a solution 132 and a plurality of nano-balls 134. Specifically, the nano-balls 134 are adhered onto the hydrophilic surface 122a of the antireflection optical film 120a. The solution 132 herein is, for example, methanol and water, the material of the nano-balls 134 is, for example, polystyrene, and the particle diameter of each the nano-ball 134 is, for example, between 100 nm and 1000 nm.

In the embodiment, the antireflection optical film 120a conformally overlays the first rough surface 112 of the silicon wafer 110. If using other methods, for example, spin coating method, due to the centrifugal force, the colloidal solution 130 is localized disposed on the hydrophilic surface 122a of the antireflection optical film 120a only. In order to avoid such situation, in the embodiment, a dropping method is adopted to drop the colloidal solution 130 on the antireflection optical film 120a. As a result, all the hydrophilic surface 122a of the antireflection optical film 120a has the colloidal solution 130.

Figure 1D:
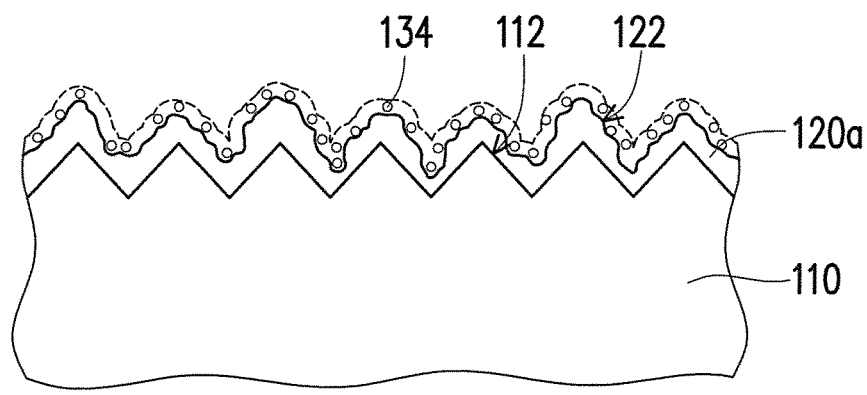
Figure 1E:
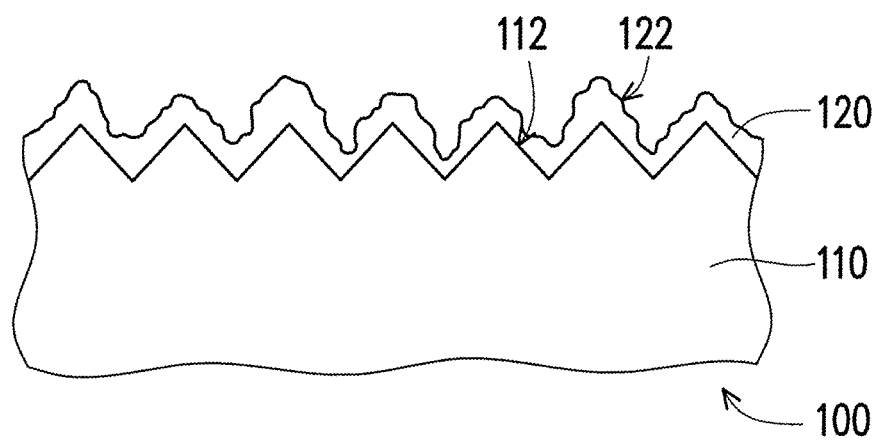

Further, referring to FIGS. 1D and 1E, the nano-balls 134 are used to serve as an etching mask to perform an etching process on the hydrophilic surface 122a of the antireflection optical film 120a so as to form an antireflection optical film 120 with a second rough surface 122, in which the roughness of the second rough surface 122 is different from the roughness of the first rough surface 112. At the time, the profile of the second rough surface 122 is an irregular and continuous pyramid structure and the antireflection optical film 120 has an uneven thickness to be disposed on the silicon wafer 110. The etching process is, for example, a reactive ion etching process, and the roughness of the second rough surface 122 is, for example, between 10 nm and 100 nm It should be noted that in the step of performing the etching process, the solution 132 and the nano-balls 134 in the colloidal solution 130 are removed as soon as the etching process ends. However, if there are nano-balls 134 adhered onto the antireflection optical film 120 after the etching process, the nano-balls 134 can be further removed through an ultrasound vibration cleaning method depending on the application requirement; or in an unshown embodiment, the nano-balls 134 are allowed to remain on the antireflection optical film 120. The above-mentioned embodiment still belongs to the technical scheme adopted by the disclosure without departing from the scope or spirit of the disclosure. At the time, the manufacturing of the antireflection substrate structure 100 is finished.

In the embodiment, the nano-balls 134 serve as an etching mask to perform the etching process on the antireflection optical film 120a with an even film thickness so as to form the antireflection optical film 120 with the second rough surface 122. That is to say, the antireflection optical film 120 after the etching process has an uneven film thickness to be disposed on the silicon wafer 110. Thus, when incident light with different wavelength irradiates the antireflection optical film 120, the second rough surface 122 of the antireflection optical film 120 and the incident light produce a destructive interference, it is not to produce the destructive interference only against the incident light with specific wavelengths. As a result, the antireflection substrate structure 100 of the embodiment has a better antireflective capacity and can be applied to a wider range.

To describe the structure, referring to FIG. 1E again, the antireflection substrate structure 100 in the embodiment includes the silicon wafer 110 and the antireflection optical film 120. The silicon wafer 110 has the first rough surface 112. The antireflection optical film 120 is disposed on the silicon wafer 110 and overlays the first rough surface 112. The antireflection optical film 120 has the second rough surface 122, the roughness of the second rough surface 122 is different from the roughness of the first rough surface 112 and the second rough surface 122 has hydrophilicity. The silicon wafer 110 herein is, for example, a polysilicon silicon wafer or an etched monocrystalline-silicon silicon wafer, which the disclosure is not limited to. The roughness of the first rough surface 112 is, for example, between 100 nm and 10000 nm and the roughness of the second rough surface 122 is, for example, between 10 nm and 100 nm. In addition, the material of the antireflection optical film 120 is, for example, silicon nitride, aluminium oxide, zinc sulphide, magnesium fluoride or titanium dioxide.

Since the antireflection optical film 120 of the antireflection substrate structure 100 has the second rough surface 122 and the roughness of the second rough surface 122 is different from the roughness of the first rough surface 112, when incident light with different wavelength (not shown) irradiates the antireflection optical film 120, the second rough surface 122 of the antireflection optical film 120 and the incident light produce a destructive interference, it is not to produce the destructive interference only against the incident light with specific wavelengths. As a result, the antireflection substrate structure 100 of the embodiment has a better antireflective capacity and can be applied to a wider range.

In summary, since the disclosure uses the nano-balls as an etching mask to perform an etching process on the antireflection optical film with an even film thickness to form the antireflection optical film having the second rough surface and the antireflection optical film at the time has an uneven film thickness to be disposed on the silicon wafer, so that when incident light with different wavelength irradiates the antireflection optical film, the second rough surface of the antireflection optical film and the incident light produce a destructive interference, not limited to the incident light with specific wavelength to produce the destructive interference only. Therefore, the antireflection substrate structure of the disclosure has a better antireflective capacity and can be applied to a broader application range.

It will be apparent to those skilled in the art that the descriptions above are several preferred embodiments of the disclosure only, which does not limit the implementing range of the disclosure. Various modifications and variations can be made to the structure of the disclosure without departing from the scope or spirit of the disclosure. The claim scope of the disclosure is defined by the claims hereinafter.

What is claimed is:

1. An antireflection substrate structure, comprises:
a silicon wafer, having a first rough surface; and
an antireflection optical film, disposed on the silicon wafer and overlaying the first rough surface, wherein the antireflection optical film has a second rough surface and roughness of the second rough surface is different from roughness of the first rough surface, the second rough surface has hydrophilicity, a profile of the first rough surface comprises a regular and continuous pyramid structure, a profile of the second rough surface comprises an irregular and continuous pyramid structure, and the second rough surface of the antireflection optical film overlays the first rough surface of the silicon wafer.

2. The antireflection substrate structure as claimed in claim 1, wherein the silicon wafer comprises a polysilicon silicon wafer or an etched monocrystalline-silicon silicon wafer.

3. The antireflection substrate structure as claimed in claim 1, wherein material of the antireflection optical film comprises silicon nitride, aluminium oxide, zinc sulphide, magnesium fluoride or titanium dioxide.

4. The antireflection substrate structure as claimed in claim 1, wherein roughness of the first rough surface is between 100 nm and 10000 nm.

5. The antireflection substrate structure as claimed in claim 1, wherein roughness of the second rough surface is between 10 nm and 100 nm.

* * * * *